United States Patent
Muro

(10) Patent No.: US 9,025,338 B2
(45) Date of Patent: May 5, 2015

(54) FIXING FITTING OF PARTS MOUNTED ON CIRCUIT BOARD

(75) Inventor: Takashi Muro, Makinohara (JP)

(73) Assignee: Yazaki Corporation, Tokyo (JP)

( * ) Notice: Subject to any disclaimer, the term of this patent is extended or adjusted under 35 U.S.C. 154(b) by 179 days.

(21) Appl. No.: 13/813,743

(22) PCT Filed: Aug. 1, 2011

(86) PCT No.: PCT/JP2011/067628
§ 371 (c)(1),
(2), (4) Date: Feb. 1, 2013

(87) PCT Pub. No.: WO2012/017997
PCT Pub. Date: Feb. 9, 2012

(65) Prior Publication Data
US 2013/0128481 A1  May 23, 2013

(30) Foreign Application Priority Data

Aug. 2, 2010 (JP) .................. 2010-173763

(51) Int. Cl.
H05K 5/00 (2006.01)
H05K 1/18 (2006.01)
H01R 12/70 (2011.01)
(Continued)

(52) U.S. Cl.
CPC .............. *H05K 1/181* (2013.01); *H01R 12/707* (2013.01); *H05K 3/303* (2013.01); *H05K 3/34* (2013.01); *H05K 2201/09781* (2013.01); *H05K 2201/10189* (2013.01); *H05K 2201/1031* (2013.01)

(58) Field of Classification Search
USPC ......... 361/760, 748, 679.01, 767; 439/55, 78, 439/79, 625, 751, 733.1
See application file for complete search history.

(56) References Cited

U.S. PATENT DOCUMENTS 5,120,256 A * 6/1992 Walden .......................... 439/553
5,411,236 A * 5/1995 Morita et al. .................. 248/500
(Continued)

FOREIGN PATENT DOCUMENTS

CN 1684306 A 10/2005
CN 2824326 Y 10/2006
(Continued)

OTHER PUBLICATIONS

Communication dated Aug. 27, 2014 from the Korean Intellectual Property Office in a counterpart Korean application No. 10-2013-7002598.
(Continued)

*Primary Examiner* — Hung S Bui
(74) *Attorney, Agent, or Firm* — Sughrue Mion, PLLC

(57) ABSTRACT

A fixing fitting includes a solder connecting plate part soldered and fixed to a surface of the circuit board by using a cream solder and a parts fixing part which is fixed to a connector to be mounted on the circuit board. On a solder connected surface of a lower surface of the solder connecting plate part, V grooves are formed which suck up the cream solder applied on the surface of the circuit board in accordance with a capillary phenomenon. Further, a plurality of communicating holes which communicate with tapered parts of the V grooves and can suck up the cream solder by the capillary phenomenon are bored from an upper surface to the lower surface of the solder connecting plate part with prescribed spaces provided between them in the direction where the V grooves extend.

8 Claims, 3 Drawing Sheets

(51) Int. Cl.
*H05K 3/30* (2006.01)
*H05K 3/34* (2006.01)

(56) References Cited

U.S. PATENT DOCUMENTS

| | | | |
|---|---|---|---|
| 5,669,783 A | 9/1997 | Inoue et al. | |
| 5,699,612 A | 12/1997 | Inoue et al. | |
| 7,048,576 B2* | 5/2006 | Nakano | 439/570 |
| 7,338,299 B1 | 3/2008 | Lee et al. | |
| 7,347,725 B2* | 3/2008 | Sakamoto | 439/566 |
| 8,821,187 B2* | 9/2014 | Aihara | 439/566 |
| 2005/0227534 A1 | 10/2005 | Nakano | |
| 2006/0121780 A1 | 6/2006 | Nakano | |
| 2008/0085616 A1* | 4/2008 | Hirai et al. | 439/83 |
| 2013/0126211 A1* | 5/2013 | Muro | 174/126.1 |

FOREIGN PATENT DOCUMENTS

| | | |
|---|---|---|
| CN | 101145416 A | 3/2008 |
| JP | 05-326807 A | 12/1993 |
| JP | 7-273422 A | 10/1995 |
| JP | 2002-280253 A | 9/2002 |
| JP | 2002-334964 A | 11/2002 |
| JP | 2006-048971 A | 2/2006 |
| JP | 2006-086028 A | 3/2006 |

OTHER PUBLICATIONS

International Search Report issued in International Application No. PCT/JP2011/067628, on Oct. 18, 2011.
Written Opinion issued in International Application No. PCT/JP2011/067628, on Oct. 18, 2011.
Communication dated Feb. 11, 2014 issued by the Korean Intellectual Property Office in counterpart Korean Patent Application No. 10-2013-7002598.
Office Action dated Jul. 15, 2014, issued by the Japanese Patent Office in counterpart Japanese Application No. 2010-173763.
Office Action dated Nov. 17, 2014, issued by the Korean Intellectual Property Office in counterpart Korean Application No. 10-2013-7002598.
Japanese Office Action dated Sep. 24, 2014 issued by Japanese Patent Office in counterpart Japanese Patent Application No. 2010-173763.
Chinese Office Action and Search Report dated Sep. 28, 2014 issued by the State Intellectual Property Office of the People's Republic of China in counterpart Chinese Application No. 201180037854.1.

* cited by examiner

FIXING FITTING OF PARTS MOUNTED ON CIRCUIT BOARD

TECHNICAL FIELD

The present invention relates to a fixing fitting which serves to fix parts such as a connector mounted on a board on a circuit board by soldering.

BACKGROUND ART

A usual example of the fixing fitting of this kind is described in patent document 1.

FIGS. 3A and 3B are diagrams showing the fixing fitting of the usual example. FIG. 3A is a perspective view of the fixing fitting. FIG. 3B is a perspective view showing a state that a connector is fixed on a circuit board by using the fixing fitting.

The fixing fitting 110 is a plate shaped member attached to both sides of a connector 102 (a parts mounted on a circuit board) mounted on a board which is mounted on the circuit board 101 and bent in the shape of L in section, and includes a solder connecting plate part 111 soldered and fixed to the surface of the circuit board 101 by using a cream solder and a parts fixing part 112 inserted and fixed to fitting attaching parts 106 of both side parts of a connector housing 103 of the connector 102.

The connector 102 has many terminals 104 attached to a rear wall part of the connector housing 103 which has a fitting opening 105 of a mate side connector in a front surface. Front ends of the terminals 104 are respectively exposed to an inner part of the fitting opening 105 of the connector housing 103. Rear leg parts of the terminals 104 which extend rearward of the connector housing 103 are respectively connected to a circuit conductor of the circuit board 101. Thus, the connector is mounted on the circuit board 101. Further, since an attaching strength is insufficient only by the above-described connection of the rear leg parts, the solder connecting plate parts 111 of the fixing fittings 110 attached to both the side parts of the connector housing 103 are soldered to the circuit board 101 by using the cream solder to fix the connector on the circuit board 101.

The solder connecting plate part 111 of the fixing fitting 100 in this case is divided into two connecting legs 111A having U shaped cut out parts 113 so as to increase the total length of a solder connected outer peripheral edge.

CITATION LIST

Patent Document

Patent Document 1: JP-A-2006-48971

SUMMARY OF INVENTION

Technical Problem

Since the usual fixing fitting 110 shown in FIG. 3A and FIG. 3B has the two connecting legs 111A provided with the U shaped cut out parts 113, an area to be connected by the solder is increased. However, a sufficient quantity of solder may not be occasionally spread to an entire part of a solder connected surface, so that there is a possibility that sufficient connection strength may not be exhibited.

Thus, it is an object of the present invention to solve the above-described problem and to provide a fixing fitting of parts mounted on a circuit board which can hold a sufficient quantity of solder on an entire surface of a solder connected surface even when an area of a solder connecting plate part is not changed, so that a high connection strength can be exhibited.

Solution to Problem

The above-object of the present invention is achieved by below-described structures.

(1) A fixing fitting of parts to be mounted on a circuit board including:

a solder connecting plate part soldered and fixed to a surface of the circuit board by using a cream solder; and a parts fixing part which is fixed to the parts to be mounted on the circuit board, wherein on a solder connected surface of a lower surface of the solder connecting plate part, grooves are formed which is configured to suck up the cream solder applied on the surface of the circuit board in accordance with a capillary phenomenon, and a plurality of communicating holes communicating with the grooves and configured to suck up the cream solder by the capillary phenomenon are bored from an upper surface to the lower surface of the solder connecting plate part with prescribed spaces provided therebetween in the direction where the grooves extend.

(2) A fixing fitting of parts to be mounted on a circuit board according to the above described (1), wherein the groove has a V groove having a section of a tapered form, the communicating hole is formed in a section more narrowed as it goes nearer to the lower surface from the upper surface of the solder connecting plate part, and the narrowed part of the communicating hole communicates with the tapered part of the V groove.

(3) A fixing fitting of parts to be mounted on a circuit board according to the above described (2), wherein the V grooves are formed linearly at prescribed intervals from a plurality of parts of an outer peripheral edge of the solder connecting plate part toward an outer peripheral edge of an opposite side.

According to the fixing fitting having the structure of the above-described (1), since the grooves and the communicating holes formed on the solder connecting plate part are combined together, a sufficient quantity of solder can be sucked up by the capillary phenomenon. Thus, the solder can be spread well to an entire surface of the solder connected surface, so that a connecting or bonding force after a re-flow can be improved.

Namely, when the grooves are formed on the solder connected surface, the solder is sucked up to inner parts of the grooves in accordance with the capillary phenomenon; however, a sucking effect is weak only by the grooves. Further, when the communicating holes are bored in the solder connecting plate part, the solder is sucked up to inner parts of the communicating holes in accordance with the capillary phenomenon; however, the sucking effect is weak only by the communicating holes.

Meanwhile, when the grooves are combined with the holes with a relation that the grooves communicate with the holes, sucking operations are added in accordance with both the capillary phenomena of the grooves and the holes. Thus, the sufficient quantity of solder is sucked up. In this case, since the plurality of holes (the communicating holes) located at separate positions are connected together by the grooves, the solder is sucked up to all the holes. As a result, the connecting or bonding force is improved.

Further, since the communicating holes are opened, heat is easily transmitted to the solder of the lower surface side through the communicating holes during the re-flow. Thus, a soldering property is improved.

According to the fixing fitting having the structure of the above-described (2), since there is a thin part in section in an intermediate part of a path from the V groove to the communicating hole, the solder is sucked up more easily. Accordingly, the quantity of the solder retained in the solder connected surface is increased to more improve the connecting or bonding force of the fixing fitting.

According to the fixing fitting having the structure of the above-described (3), since the plurality of V grooves provided at prescribed intervals are extended from the outer peripheral edge of the solder connecting plate part toward the outer peripheral edge of the opposite side, the solder can be sucked up from a wide area and the sufficient quantity of solder can be effectively spread to the entire part of the solder connected surface.

Further, since the linear grooves are provided in the lower surface of the solder connecting plate part, a deterioration of flatness of the solder connecting plate part during a production can be prevented by a reinforcing function of the grooves.

BRIEF DESCRIPTION OF DRAWINGS

FIG. 1A is a perspective view. FIG. 1B is a sectional view taken along a line B-B shown by arrow marks in FIG. 1A. FIG. 1C is a perspective view of a part shown in FIG. 1B.

FIG. 2A is a perspective view of an entire part. FIG. 2B is an enlarged perspective view of its main parts.

FIG. 3A is a perspective view of the fixing fitting. FIG. 3B is a perspective view showing a state that a connector is fixed on a circuit board by using the fixing fitting.

DESCRIPTION OF EMBODIMENTS

Figure 1A:
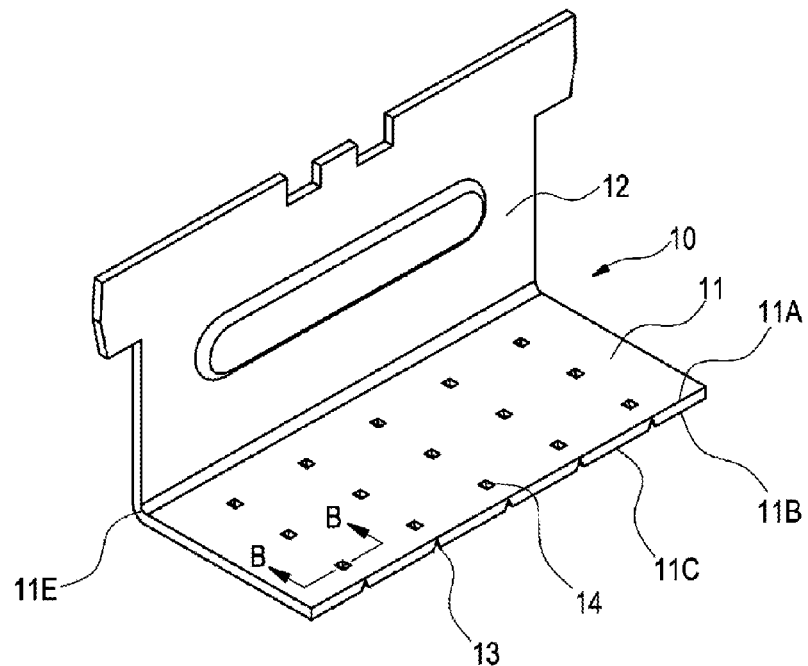
FIGS. 1A to 1C are structural views of a fixing fitting of an exemplary embodiment of the present invention.

Now, the exemplary embodiment of the present invention will be described below by referring to the drawings.

Figure 1B:
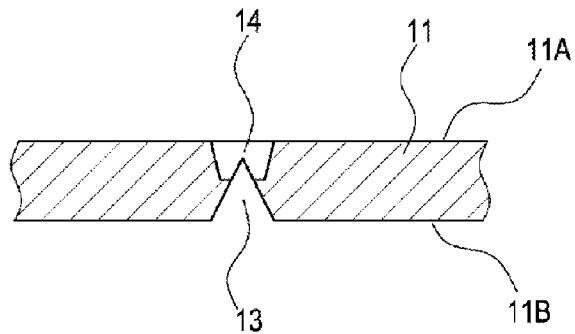
Figure 1C:
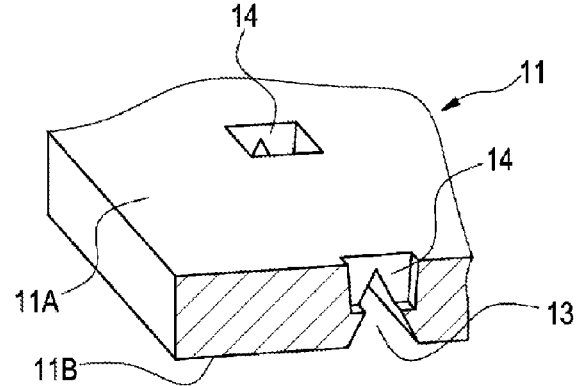
Figure 2A:
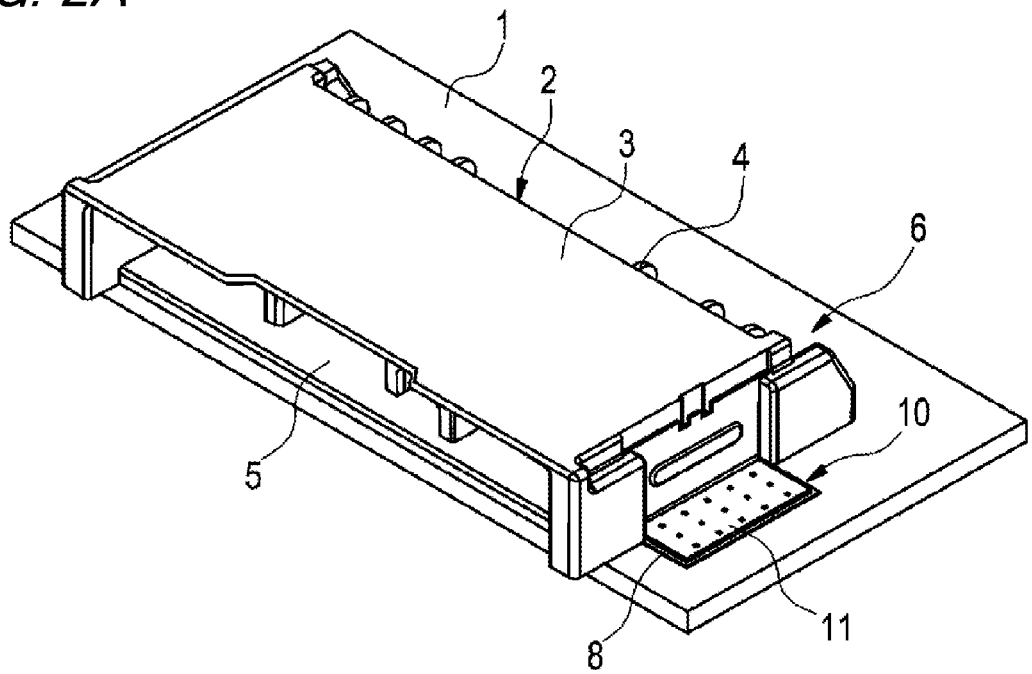
FIGS. 2A and 2B are diagrams showing a state that a connector mounted on a board is fixed on a circuit board by using the fixing fitting of the exemplary embodiment of the present invention.
Figure 2B:
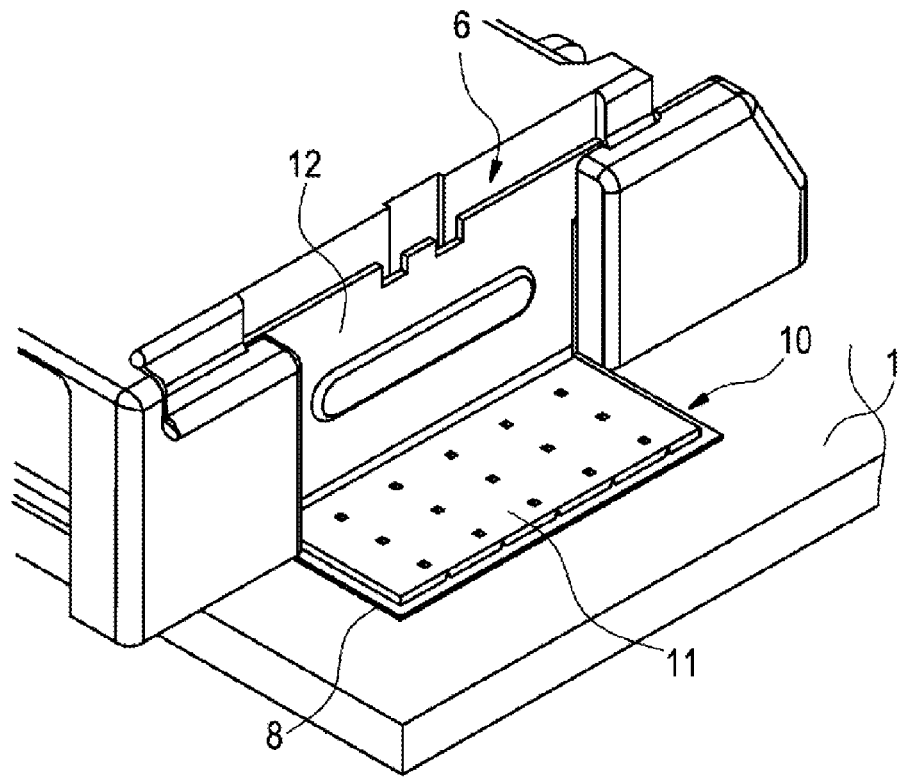
Figure 3A:
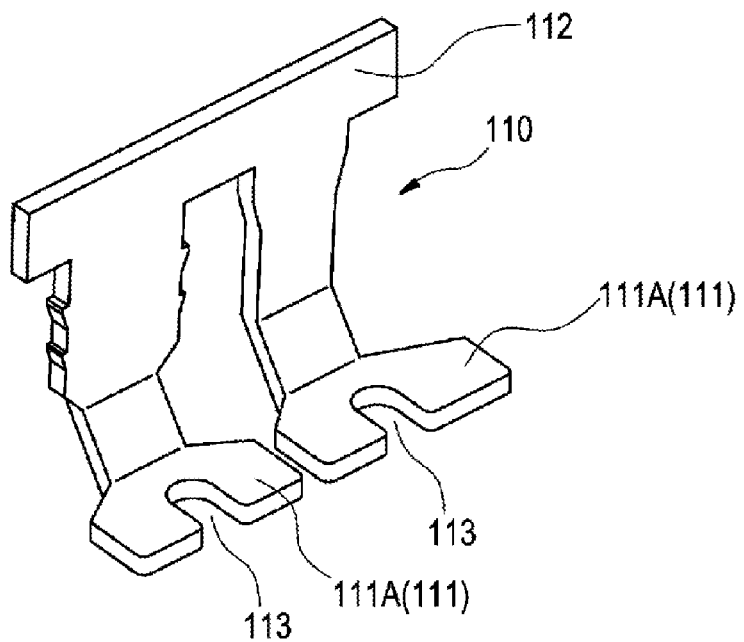
FIGS. 3A and 3B are diagrams showing a fixing fitting of a usual example.
Figure 3B:
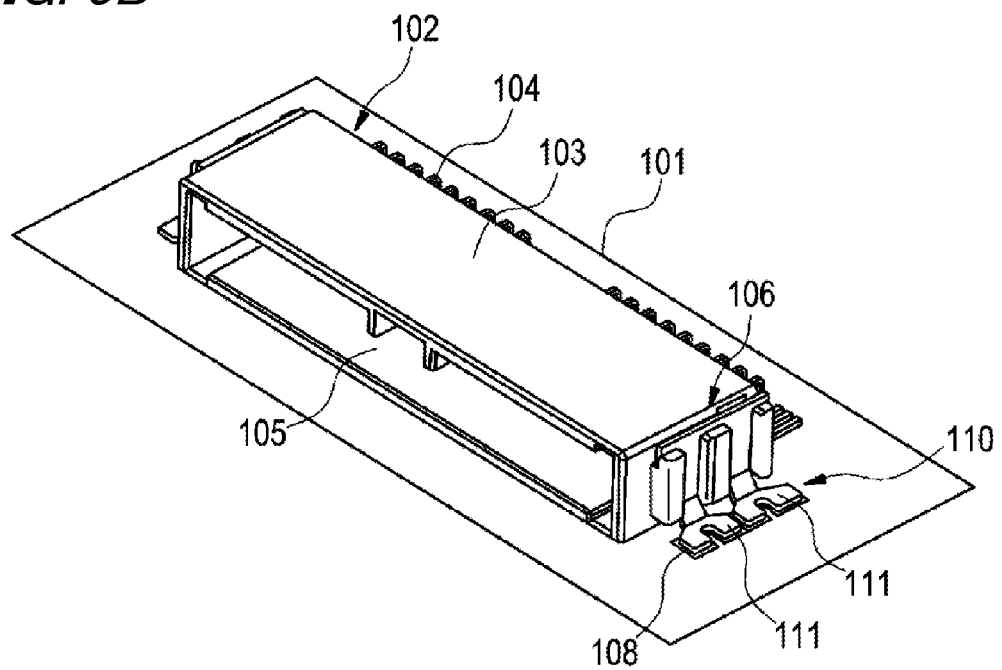

FIGS. 1A to 1C are structural views of a fixing fitting of the exemplary embodiment of the present invention. FIG. 1A is a perspective view. FIG. 1B is a sectional view taken along a line B-B shown by arrow marks in FIG. 1A. FIG. 1C is a perspective view of a part shown in FIG. 1B. FIGS. 2A and 2B are diagrams showing a state that a connector mounted on a board is fixed on a circuit board by using the fixing fitting. FIG. 2A is a perspective view of an entire part. FIG. 2B is an enlarged perspective view of its main parts.

As shown in FIG. 1A to FIG. 1C and FIG. 2A and FIG. 2B, the fixing fitting 10 of this exemplary embodiment is a plate shaped member attached to both sides of a connector 2 (a parts mounted on a circuit board) mounted on a board which is mounted on the circuit board 1 and bent in the shape of L in section, and includes a solder connecting plate part 11 soldered and fixed to the surface of the circuit board 1 by using a cream solder and a parts fixing part 12 inserted and fixed to fitting attaching parts 6 of both side parts of a connector housing 3 of the connector 2.

The connector 2 has many terminals 4 attached to a rear wall part of the connector housing 3 which has a fitting opening 5 of a mate side connector in a front surface. Front ends of the terminals 4 are respectively exposed to an inner part of the fitting opening 5 of the connector housing 3. Rear leg parts of the terminals 4 which extend rearward of the connector housing 3 are respectively connected to a circuit conductor of the circuit board 1. Thus, the connector is mounted on the circuit board 1.

Further, since an attaching strength is insufficient only by the above-described connection, lower surfaces (solder connected surfaces) 11B of the solder connecting plate parts 11 of the fixing fittings 10 attached to both the side parts of the connector housing 3 are soldered to the circuit board 1 by using the cream solder to fix the connector on the circuit board 1.

In this case, as shown in FIG. 1A to FIG. 1C, on the solder connected surface of the lower surface 11B of the solder connecting plate part 11 of the fixing fitting 10, V grooves 13 are formed which suck up the cream solder applied on the surface of the circuit board 1 in accordance with a capillary phenomenon. Further, a plurality of square communicating holes 14 which communicate with the V grooves 13 and can suck up the cream solder by the capillary phenomenon are bored from an upper surface 11A to the lower surface 11B of the solder connecting plate part 11 with prescribed spaces provided between them in the direction where the V grooves 13 extend.

The V groove 13 has a V shaped section of a tapered form. The communicating hole 14 is formed in a section more narrowed as it goes nearer to the lower surface 11B from the upper surface 11A of the solder connecting plate part 11. The narrowed part of the communicating hole 14 is allowed to communicate with the tapered part of the V groove 13. Further, the V grooves 13 are formed linearly and in parallel with each other at prescribed intervals in an extending direction of an outer peripheral edge 11C from a plurality of parts of the outer peripheral edge 11C of the solder connecting plate part 11 located in a position distant from the parts fixing part 12 toward an outer peripheral edge 11E of an opposite side. The communicating holes 14 are also arranged at prescribed intervals in longitudinal and transverse directions.

When the connector 2 is mounted on the circuit board 1 by using the fixing fitting 10, the cream solder is applied to a part on which the solder connecting plate part 11 of the fixing fitting 10 and the solder connecting plate part 11 of the fixing fitting 10 is mounted thereon and allowed to pass a re-flow vessel to connect the solder connecting plate part 11 on a land of the circuit board 1. At that time, since the V grooves 13 and the communicating holes 14 formed on the solder connecting plate part 11 are combined together, a sufficient quantity of solder can be sucked up by the capillary phenomenon. Thus, the solder can be spread well to an entire surface of the solder connected surface (the lower surface of the solder connecting plate part 11), so that a connecting or bonding force after the re-flow can be improved.

Namely, when the V grooves 13 are formed on the solder connected surface, the solder is sucked up to inner parts of the V grooves 13 in accordance with the capillary phenomenon; however, a sucking effect is weak only by the V grooves 13. Further, when the communicating holes 14 are bored in the solder connecting plate part 11, the solder is sucked up to inner parts of the communicating holes 14 in accordance with the capillary phenomenon; however, the sucking effect is weak only by the communicating holes 14.

On the other hand, when the V grooves 13 are combined with the communicating holes 14 with a relation that they communicate mutually, sucking operations are added in accordance with both the capillary phenomena of the V grooves 13 and the communicating holes 14. Thus, the sufficient quantity of solder is sucked up. In this case, since the plurality of communicating holes 14 located at separate positions are connected together by the V grooves 13, the solder is sucked up to all the communicating holes 14. As a result, the connecting or bonding force is improved.

Further, since the communicating holes 14 are opened, heat is easily transmitted to the solder of the lower surface side through the communicating holes 14 during the re-flow. Thus, a soldering property is improved.

Further, since there is a thin part in section in an intermediate part of a path from the V groove 13 to the communicating hole 14, the solder is more easily sucked up. Accordingly, the quantity of the solder retained in the solder connected surface is increased to more improve the connecting or bonding force of the fixing fitting 10.

Further, since the plurality of V grooves 13 provided at prescribed intervals are extended linearly from the outer peripheral edge 11C of the solder connecting plate part 11 toward the outer peripheral edge 11E of the opposite side, the solder can be effectively sucked up from a wide area and the sufficient quantity of solder can be effectively spread to the entire part of the solder connected surface.

Further, since the linear V grooves 13 are provided in the lower surface 11B of the solder connecting plate part 11, a reinforcing function of the V grooves 13 can be obtained and a deterioration of flatness of the solder connecting plate part 11 during a production can be prevented.

The present invention is not limited to the above-described exemplary embodiment and may be suitably modified and improved. In addition thereto, materials, forms, dimensions, numbers, arranged positions, etc. of component elements in the above-described exemplary embodiment may be arbitrarily and do not need to be limited as long as the present invention can be achieved.

For instance, in the above-described exemplary embodiment, a case is mentioned that grooves are the V grooves 13; however, grooves having other sectional forms may be provided. Further, in the above-described exemplary embodiment, a case is mentioned that the communicating hole 14 is the square hole; however, the communicating hole may be a round hole.

It is apparent to those skilled in the art that the present invention has been described with reference to specific embodiments, but the present invention can be properly modified or revised, without deviating from the scope of the invention.

This application is based on the Japanese patent application (patent application 2010-173763) filed on Aug. 2, 2010, whose content is incorporated herein by reference.

INDUSTRIAL APPLICABILITY

According to the present invention, even when an area of the solder connecting plate part is not changed, the sufficient quantity of solder can be held in the entire surface of the solder connected surface, so that high connection strength can be exhibited.

REFERENCE SIGNS LIST

1 . . . circuit board 2 . . . connector (parts to be mounted on circuit board) 10 . . . fixing fitting 11 . . . solder connecting plate part 11A . . . upper surface 11B . . . lower surface 11C, 11E . . . outer peripheral surface 12 . . . parts fixing part 13 . . . V groove 14 . . . communicating hole

The invention claimed is:

1. A fixing fitting of parts to be mounted on a circuit board including:
a solder connecting plate part configured to be soldered and fixed to a surface of the circuit board; and
a parts fixing part configured to be fixed to the parts to be mounted on the circuit board,
wherein the solder connecting plate part includes:
a plurality of grooves including a first groove and a second groove, the first and second grooves extending along a first direction, being formed on a lower surface of the solder connecting plate part, and being configured to suck up a cream solder applied on the surface of the circuit board in accordance with a capillary phenomenon; and
a plurality of communicating holes including a first group of communicating holes aligned in the first direction over the first groove and a second group of communicating holes aligned in the first direction over the second groove, and
wherein the plurality of communicating holes are bored from an upper surface to the lower surface of the solder connecting plate such that the first and second groups of communicating holes communicate with the respective grooves to suck up the cream solder by the capillary phenomenon.

2. The fixing fitting of parts to be mounted on a circuit board according to claim 1, wherein the plurality of grooves each have a v-shaped cross section, the communicating holes are each wider at the upper surface of the solder connecting plate part than at a position where the communicating hole communicates with the respective groove.

3. A fixing fitting of parts to be mounted on a circuit board according to claim 2, wherein the grooves are formed linearly at prescribed intervals along a second direction that is orthogonal to the first direction from an outer peripheral edge of the solder connecting plate part toward an outer peripheral edge of an opposite side.

4. A fitting including:
a solder connecting plate part configured to be soldered and fixed to a surface; and
a fixing part configured to be fixed to a part to be mounted on the surface,
wherein the solder connecting plate part includes:
an upper surface;
a lower surface that includes a continuous groove that extends in a first direction; and
a plurality of openings between the upper surface and the lower surface that pass through the groove.

5. The fitting according to claim 4, wherein the openings are uniformly spaced apart from one another along the first direction.

6. The fitting according to claim 4, wherein, in a cross-sectional view through a portion of the solder connecting plate, the groove is v-shaped.

7. The fitting according to claim 6, wherein, in a cross-sectional view through an opening portion of the solder connecting plate, the opening tapers toward the groove.

8. A fitting including:
a solder connecting plate part configured to be soldered and fixed to a surface; and
a fixing part configured to be fixed to a part to be mounted on the surface,
wherein the solder connecting plate part includes:
an upper surface;
a lower surface that includes a groove whose longitudinal extension line is from an outer peripheral edge of the solder connecting plate toward the fixing part; and
a plurality of openings between the upper surface and the lower surface that pass through the groove.

* * * * *